US006668332B1

(12) United States Patent
McNeil

(10) Patent No.: US 6,668,332 B1
(45) Date of Patent: Dec. 23, 2003

(54) FUNCTIONAL CLOCK OBSERVATION CONTROLLED BY JTAG EXTENSIONS

(75) Inventor: William Lloyd McNeil, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/504,367

(22) Filed: Feb. 15, 2000

(51) Int. Cl.$^7$ ................................................ G06F 1/00
(52) U.S. Cl. .................................................... 713/500
(58) Field of Search ................................ 713/500, 503, 713/600

(56) References Cited

U.S. PATENT DOCUMENTS 4,362,957 A    12/1982   Stern .......................... 307/480
4,833,397 A    5/1989    McMurray ................. 324/73 R
5,264,746 A    11/1993   Ommea et al. ............. 307/269
5,428,626 A    6/1995    Frish et al. .................... 371/27
5,581,699 A    12/1996   Casal et al. ............ 395/185.08
5,754,063 A    5/1998    Lee .............................. 327/18
5,812,562 A    9/1998    Baeg ....................... 371/22.31
5,878,055 A    3/1999    Allen ........................ 371/27.1

OTHER PUBLICATIONS

IBM Technical Disclosue Brochure—"N–Way Testpoint for Complex LSI Design" vol. 14 No. 10 Mar. 1972.

Primary Examiner—Thomas M. Heckler
(74) Attorney, Agent, or Firm—Joscelyn G. Cockburn

(57) ABSTRACT

Internal clock signals generated on a chip can be viewed externally by multiplexing the clock signals and functional output signals to pin that are used to view or access the functional output signals. JTAG facilities already provided on the chip are used to generate control signals that drive the multiplexers. By so doing no new input or output facilities are required to view the clock signals.

13 Claims, 3 Drawing Sheets

Problem Solution

Problem Solution

FUNCTIONAL CLOCK OBSERVATION CONTROLLED BY JTAG EXTENSIONS

RELATED APPLICATIONS

The present invention is related to the subject matter of the following commonly assigned copending U.S. patent application, Ser. No. 09/504,973, which was filed concurrently with the present application, on the same day.

The content of the above-referenced copending patent application Ser. No. 09/504,973 is incorporated herein by reference.

TECHNICAL FIELD

The present invention relates to a system for functional clock observation, controlled by JTAG extensions, for the purpose of verifying the integrity of signals

BACKGROUND OF THE INVENTION AND PRIOR ART

The problem to be addressed is that clock signals present inside a VLSI module or chip need to be observed at the chips outputs, for the purpose of verifying the integrity of the signals. These clock signals are generated inside the chip (by a PLL 102 or other clock generation circuitry 104). If these signals are not being generated correctly, incorrect chip operations can result., or chip timing margins may be degraded. These types of Chip failures and problems that occur due to incorrect clocks are frequently very difficult to diagnose without the clocks being observable. This makes the ability to observe the clocks a highly desirable feature for any chip containing complex clock generation circuitry, such as a PLL. The present invention addresses these problems.

If the chip has spare output pins that would otherwise be unused, then providing clock observations is a simple matter of connecting the clock signals to the output pins. Since this frequently is not the case, it is necessary to multiplex functional chip signals with the clock signals. This allows a common set of chip output pins to be used for both normal functional signals, as well as the clock signals. However, since the clock signals being observed may not be operating correctly, it is necessary that the circuitry which controls the multiplexing circuitry, be completely independent of the clock signals themselves.

SUMMARY OF THE INVENTION

The present invention solves the problem outlined above, by adding circuitry to the part of the chip which implements IEEE Standard 1149.1 (IEEE Test Access Port and Boundary Scan Architecture, A.K.A. JTAG). Since JTAG circuitry uses clocking that is required to be independent of any other clocking domains on the chip, the requirement detailed above is met.

Furthermore, by adding the clock observation control circuity there, the already existing chip input and output pins which are used to provide the required JTAG signals, may also be used to access the clock observation circuitry. This solves the problem detailed above, without requiring any additional chip pins to be used to control the clock observation circuitry.

DETAILED DESCRIPTION OF THE PREFERRED EMBODIMENT

A JTAG design-specific data register (DSR) is added to the JTAG design. A latch (Itch) is also added. This latch is used to control the clock observation multiplexer that is selected between a clock signal and a functional signal. When Itch=0, the multiplexer selects the functional signal. When Itch=1, the multiplexer selects the clock signal.

When the chip's functional reset input signal is asserted, Itch is reset to "0". This causes the clock observation multiplexer to select the functional signal, thus enabling normal functional operation of the multiplexed clock observation/functional chip output.

When any write occurs (via the JTAG interface) to the DSR, the write causes the DSR and the latch to be set to "1". This causes the clock observation multiplexer to select the clock signal, thus enabling clock observation operation of the multiplexed clock observation/functional chip output.

Figure 1:
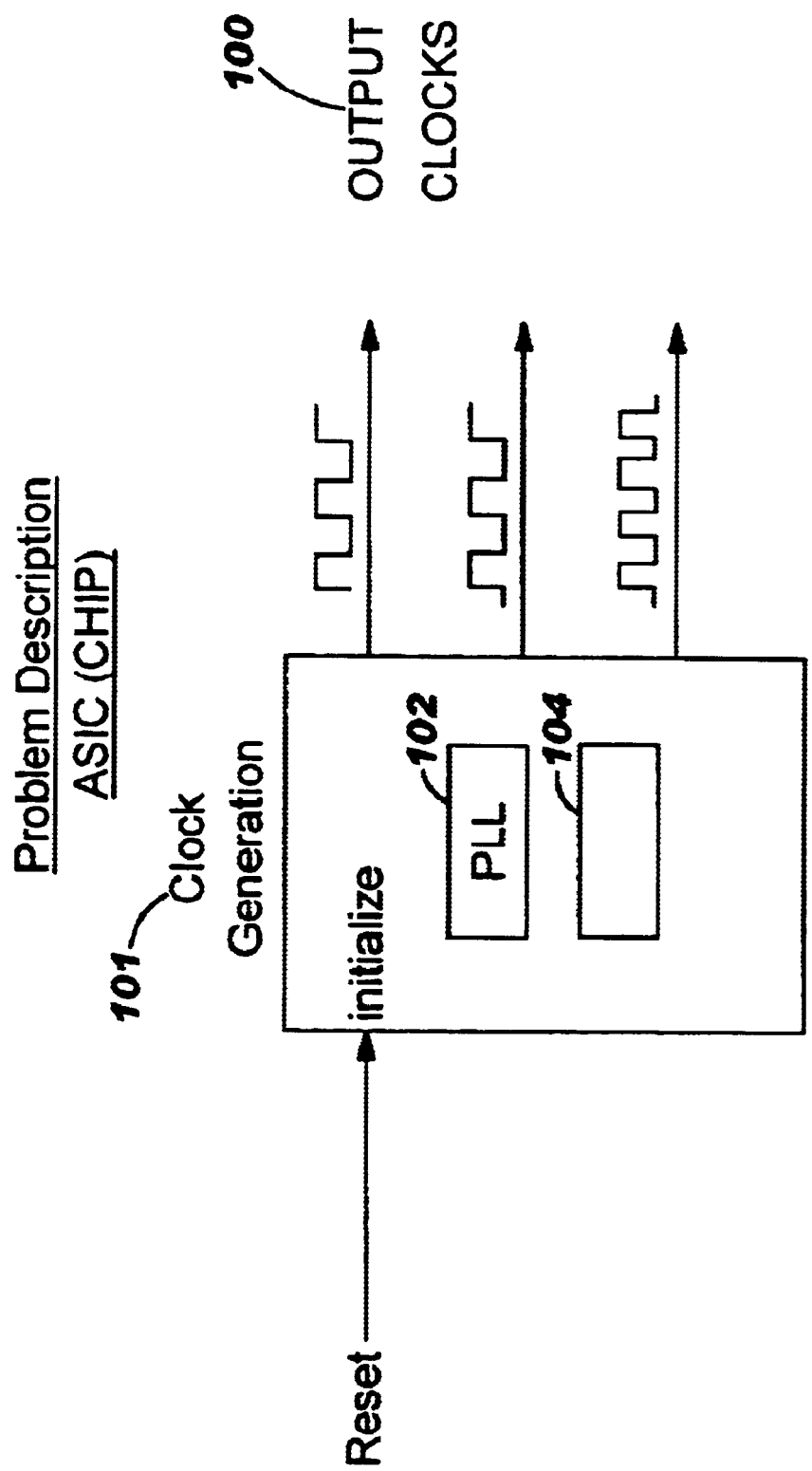
FIG. 1 This represents a description of the problem showing a ASIC (Chip).
Figure 2:
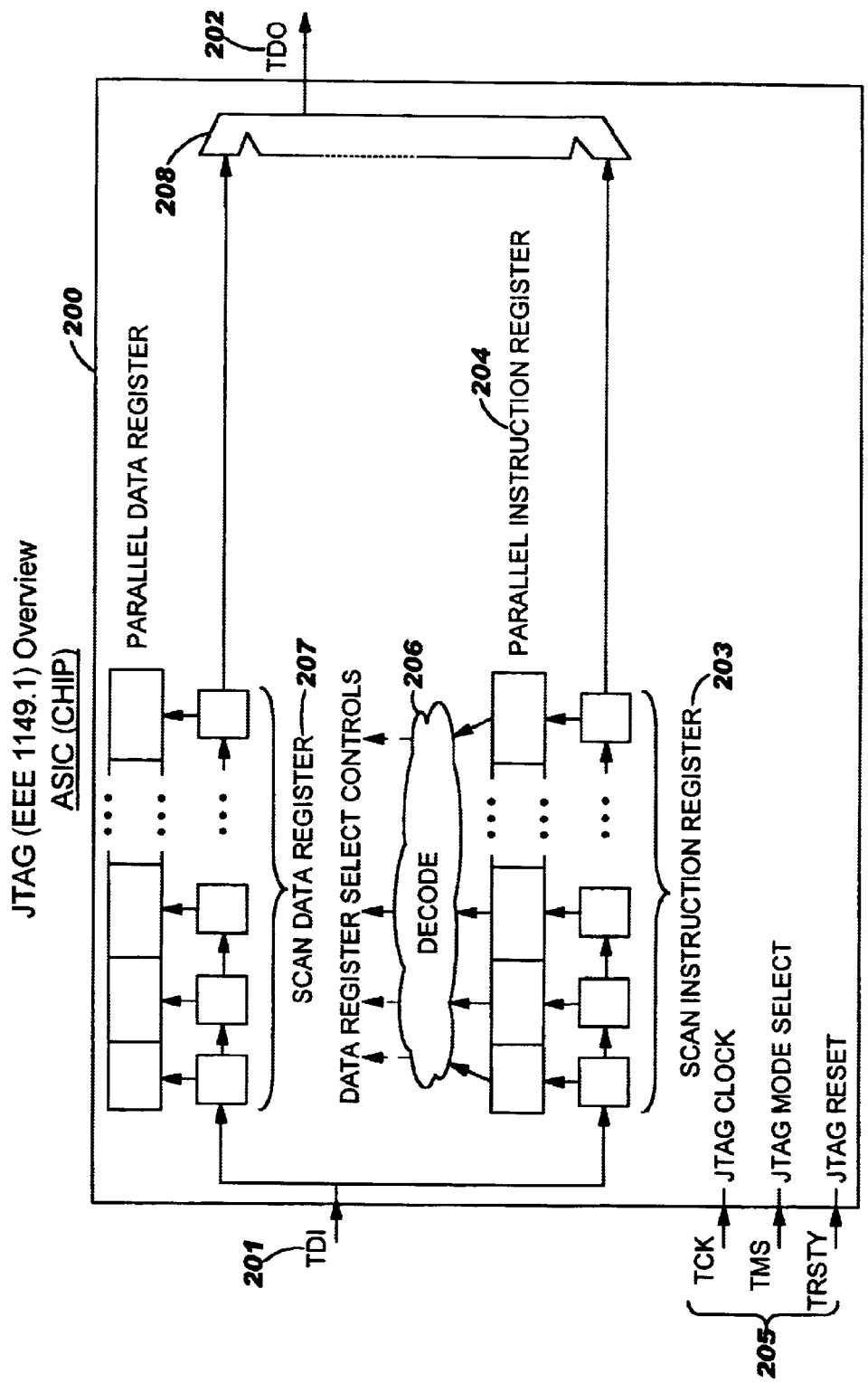
FIG. 2 shows JTAG (IEEE 1149.1) Overview showing a ASIC (Chip)
Figure 3:
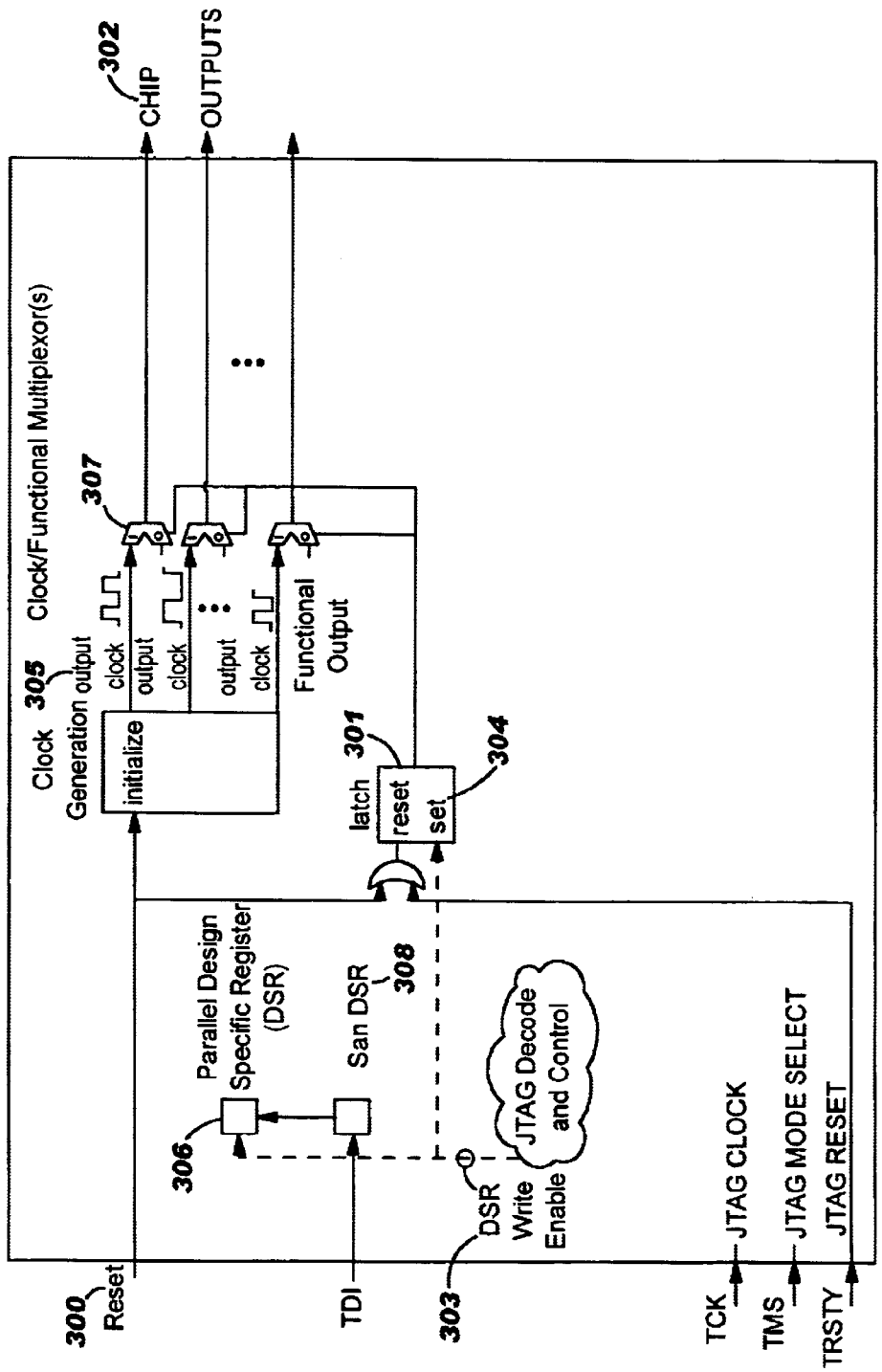
FIG. 3 representation the solution of the problem as outlined in the Summary and description of the invention.

The invention will now be illustrated by several FIGS. 1, 2 and 3. FIG. 1, represents a problem description of a ASIC (Chip). The Figure notes that if output clocks at location 100, are not being generated correctly, due to any reason, such as a logical error in the clock generation (location 101) logic or noise, then the types of failures which may occur are very difficult to diagnose without having observability of the output clocks at 100. A typical method to provide observability is to multiplex the output clock signals with other chip outputs.

Control of the multiplexer circuit described above, must be generated in a way that is completely independent of the output clocks being observed. This is because as noted above, the output clocks may be malfunctioning.

FIG. 2 Represents a JTAG (IEEE 1149.1) Overview of an ASIC CHIP located at 200, showing the input into the chip at 201 and the output at 202. The chip shows the scan instruction register at 203, the parallel instruction register at 204. The JTAG clock, the JTAG mode select and the JTAG Reset are seen at 205 respectively. The instruction decode is seen at 206, the scan data register select controls seen at 207. The multiplexer is located at 208.

FIG. 3 The figure represents the solution to the problem outline earlier in the Specification. The solution to the problem is achieved without requiring any dedicated chip input or output signals.

The functional chip input Reset at location 300, causes latch at 301 to reset, and chip outputs at 302, to carry functional outputs. Any write to the DSR at 303, causes the latch to be set, at 304, and the chip outputs to carry the output clocks 305. The "Parallel Design" Specific Register (DSR) is located at 306. The Clock/Functional Multiplexer (s) are located at 307 and the "Scan DSR" is located at 308.

While the invention has described with respect to a specific embodiment, it will be obvious to those skilled in this art that changes in both from and/or detail may be made without a departure from the scope and/or spirit of the invention.

I claim:

1. A chip comprising:

at least one output to which functional output signals are ported;

at least one multiplexer having an output operatively coupled to the at least one output;

means for generating first signals representing a predefined function operatively coupled to the multiplexer;

functional output signals representing at least one function being generated on said chip operatively coupled to the multiplexer; and a controller that generates a control signal that causes the multiplexer to select between the functional output signals and the first signals operatively coupled to said at least one multiplexer wherein the selected signal is made available at the at least one output.

2. The chip of claim 1 wherein the means for generating the first signals includes on chip clock generation circuit.

3. The chip of claim 2 wherein the on chip generation circuit includes at least one phase lock loop.

4. The chip of claim 1 wherein the controller includes design specific register (DSR) system;

on chip JTAG facilities operatively coupled to the design specific register system;

a latch having an output operatively connected to the at least one multiplexer, a reset input and a set input; and a write input line operatively coupled to the set input.

5. The chip of claim 4 wherein if a write signal is applied to the write input line the latch is set and causes the at least one multiplexer to switch state.

6. The chip of claim 4 further including a logical OR circuit having an output operatively connected to the reset input of said latch and inputs operatively coupled to the JTAG reset line and the chip reset line.

7. The chip of claim 4 wherein the design specific register system includes at least a one bit scan register and at least a one bit parallel register wherein the scan register and parallel register are configured in accordance with JTAG standard.

8. The chip of claim 4 wherein the JTAG facilities include the JTAG clock, mode select and reset lines.

9. The chip of claim 8 wherein the JTAG facilities further include JTAG decode and control circuitry and JTAG Test Data Input (TDI) signal line.

10. A chip including:

at least one multiplexer that provides output functional signals on a common set of pins representative of functions generated on said chip as well as predefined signals generated on said chip; and a controller operatively coupled to the multiplexer, said controller generating control signals that cause the multiplexer to switch between the output functional signals and the predefined signals.

11. The chip of claim 10 wherein the predefined signals include clock signals generated internal to the chip.

12. A method comprising acts of:

generating on a chip a first set of signals representative of functions provided on said chip;

generating on said chip a second set of signals representative of a predefined function available on said chip;

multiplexing with a multiplexer the first set of signals as well as the second set of signals to input/output pins of said chip; and generating control signals that cause said multiplexer to switch between the first set of signals and the second set of signals.

13. The method of claim 12 wherein the second set of signals includes clock signals generated internal to the chip.

* * * * *